(12) United States Patent
Nakase et al.

(10) Patent No.: US 6,206,087 B1
(45) Date of Patent: Mar. 27, 2001

(54) HEAT SINK FAN

(75) Inventors: Mitsunobu Nakase; Fumihiro Umeda, both of Yonago (JP)

(73) Assignee: Nidec Corporation, Kyoto (JP)

( * ) Notice: Subject to any disclaimer, the term of this patent is extended or adjusted under 35 U.S.C. 154(b) by 0 days.

(21) Appl. No.: 09/585,499

(22) Filed: Jun. 1, 2000

Related U.S. Application Data

(62) Division of application No. 09/069,365, filed on Apr. 29, 1998, now Pat. No. 6,109,340.

(30) Foreign Application Priority Data

Apr. 30, 1997 (JP) ................................... 9-112801
Dec. 12, 1997 (JP) ................................... 9-362834

(51) Int. Cl.[7] .................................... F28F 7/00
(52) U.S. Cl. ................. 165/80.3; 165/104.33; 165/121; 361/697; 361/718; 174/16.3; 257/713
(58) Field of Search .................. 165/121, 80.3, 165/104.33, 185; 415/177, 178, 179; 361/697, 709; 174/36.3; 257/713

(56) References Cited

U.S. PATENT DOCUMENTS

| | | | |
|---|---|---|---|
| 5,335,722 | * 8/1994 | Wu ...................................... | 165/122 |
| 5,495,392 | * 2/1996 | Shen .................................... | 361/697 |
| 5,522,700 | * 6/1996 | Hong .................................... | 415/177 |
| 5,615,998 | * 4/1997 | Kodama et al. ..................... | 165/80.3 |
| 5,701,951 | * 12/1997 | Jean .................................... | 165/80.3 |
| 6,109,340 | * 8/2000 | Nakase et al. ....................... | 165/80.3 |

* cited by examiner

Primary Examiner—Ira S. Lazarus
Assistant Examiner—Terrell McKinnon
(74) Attorney, Agent, or Firm—McCormick, Paulding & Huber LLP

(57) ABSTRACT

The heat sink fan for cooling a heat generating device as disclosed in the present invention is provided with a heat sink that is to be directly mounted on the heat generating device to thereby absorb or disperse the heat generated by the heat generating device, and a housing that is detachably engaged to the heat sink and equipped with a fan, which in turn creates air flow to forcibly cool the heat sink. The housing has a top wall portion and a pair of side wall portions extending vartically downwardly from both sides of this top wall portion, the side wall portions being disposed at both sides of the heat sink and provided with an engaging element at which tip an engaging projection is formed. The housing may be detachably coupled with the heat sink the engaging projection being permitted to engage a retaining means formed on a circuit board on which the heat sink or the heat generating device is mounted.

8 Claims, 8 Drawing Sheets

Fig. 2
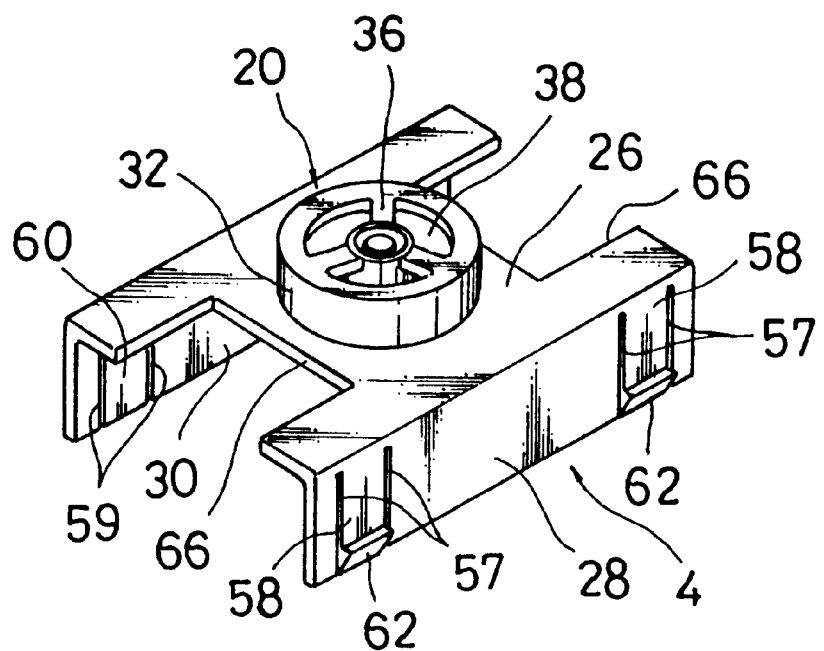
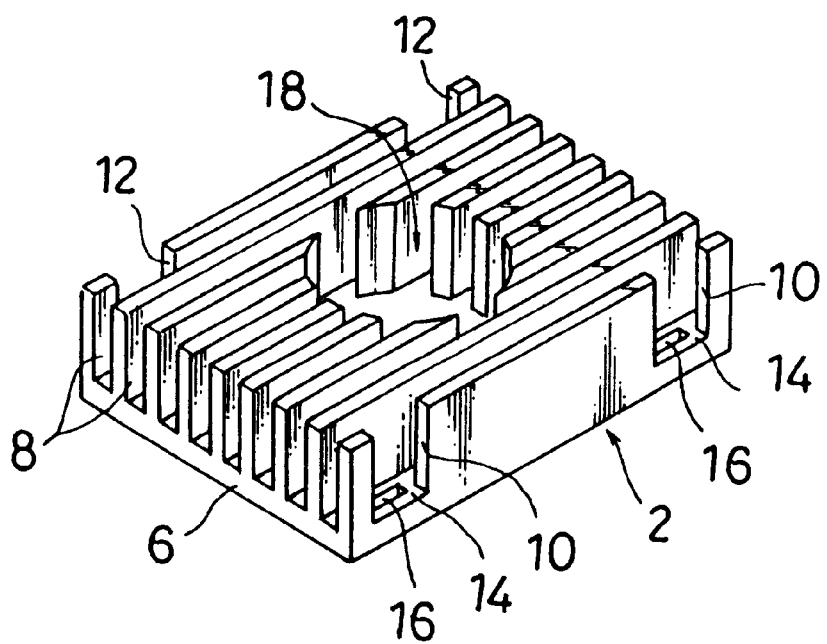

Fig.8
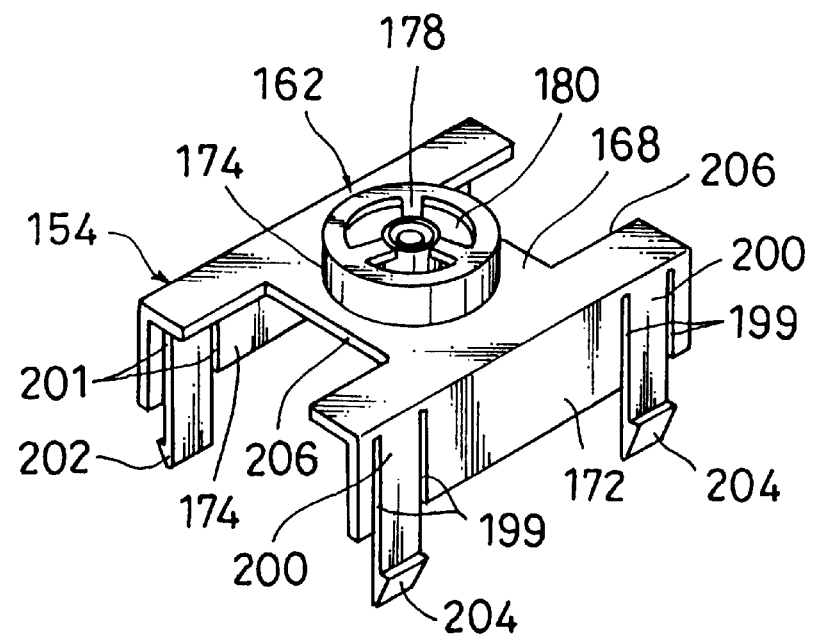
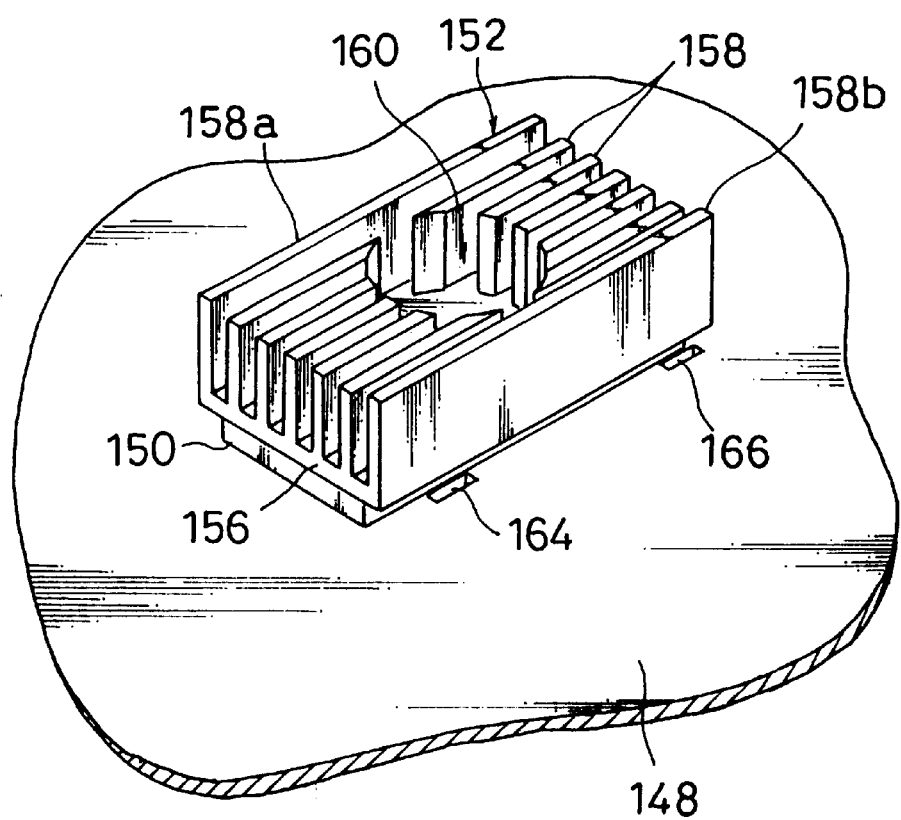

HEAT SINK FAN

This is a divisional of application Ser. No. 09/069,365, filed Apr. 29, 1998 which issued on Aug. 29, 2000 as U.S. Pat. No. 6,109,340.

BACKGROUND OF THE INVENTION

The present invention relates to heat sink fans for cooling heat generating devices, and more particularly pertains to heat sink fans for cooling semiconductor devices such as microprocessors.

A heat sink fan for cooling a heat generating device such as a semiconductor device is disclosed in, for example U.S. Pat. No. 5,484,013. As disclosed in U.S. Pat. No. 5,484,013, the conventional heat sink fan includes a heat sink that is to be mounted on a heat generating device and a housing that is to be detachably coupled to the heat sink. A fan attached to the housing forcibly cools the heat sink by air flow generated by the fan.

FIG. 10 illustrates an example of a conventional heat sink fan. In general, in order to facilitate engagement of a housing 302 with a heat sink 304 as well as to facilitate coupling of the housing 302 with the heat sink 304, a heat sink fan 300 for cooling a semiconductor device such as a microprocessor is configured such that the housing 302 can be attached to and detached from the heat sink 304 with the housing 302 being rotated relative to the heat sink 304 about an axis extending vertically. In addition, the housing 302 and the heat sink 304 are provided with first and second interlocking means 306a and 306b for detachably retaining the housing 302 and the heat sink 304 relatively at position. The first interlocking means 306a comprises, for example, a combination of a flange 307 and a pawl 308 that disengageably engages the flange 307 and that can move relative to the flange 307. For example, the flange 307 is provided on the housing 302, and the pawl 308 on the heat sink 304, respectively. Furthermore, the second interlocking means 306b comprises a combination of a projection 310 and a depression 312 which disengageably engage each other. For example, the projection 310 is provided on the housing 302, and the depression 312 on the heat sink 304, respectively.

In such a conventional heat sink fan 300, when the housing 302 is turned in a predetermined direction relative to the heat sink 304 with the flange 307 of the first interlocking means 306a engaging the pawl 308, the projection 310 of the second interlocking means 306b is brought into engagement with the depression 312 to detachably couple the housing 302 with the heat sink 304. When the housing 302 is turned in the opposite direction from the coupled position, relative to the heat sink 304, the projection 310 of the second interlocking means 306b disengages from the depression 312, followed by disengagement of the flange 307 of the first interlocking means 306a from the pawl 308, so that the housing 302 is separated from the heat sink 304.

However, as the engagement structure as mentioned above is constructed such that the housing and the heat sink are relatively rotated, it can be applied to a case where a heat generating device is square in shape, whereas it is not suited to a case, by for example, when such a heat generating device is rectangular, (the housing and the heat sink will also be rectangular correspondingly). Consequently, it is desired to have an engagement structure that is applicable irrespective of the geometry or shape of a heat generating device.

Further, U.S. Pat. No. 5,484,013 discloses a heat sink fan in which the housing and the heat sink are to be coupled with each other with the housing being moved to the heat sink in the direction perpendicular to the plate of the heat sink. However, this heat sink fan has a complex structure for disengageably engaging the heat sink with the housing.

Still furthermore, U.S. Pat. No. 5,615,998 discloses a heat sink fan having a coupling structure that disengageably engages each other without rotating the housing relative to the heat sink. In this type of heat sink fan, however, the geometry and detaching structure of the heat sink and the housing are also complicate. Such a complicate structure will be a factor of increasing costs of molds and correspondingly raising production costs.

SUMMARY OF THE INVENTION

Accordingly, it is an object of the present invention to provide a heat sink fan of which heat sink and housing are detachable from each other with a simple structure.

It is also another object of the present invention to provide a heat sink fan that can reliably couple the heat sink with the housing together by simple operation.

It is yet another object of the present invention to provide a heat sink and a housing with a detachable coupling structure that can be applied irrespective of the geometry of a heat generating device.

It is still further object of the present invention to provide a heat sink fan that can be detachably assembled with a simple structure wherein the heat sink and the housing is coupled with each other without being turned relatively.

The heat sink fan of the present invention is provided with a heat sink that is to be directly mounted on the heat generating device to absorb and disperse the heat generated by the heat generating device, and a housing that is detachably engaged to the heat sink and equipped with a fan, which in turn creates air flow to forcibly cool the heat sink. The housing has a top wall portion and a pair of side wall portions extending vartically downwardly from both sides of this top wall portion, the side wall portions being disposed at both sides of the heat sink and provided with an engaging element at which tip an engaging projection is formed. The housing may be detachably coupled with the heat sink the engaging projection being permitted to engage a retaining means formed on a circuit board on which the heat sink or the heat generating device is mounted.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2 is a perspective view of the first embodiment in which the housing is detached from the heat sink of the heat sink fan shown in FIG. 1.

FIG. 8 is a perspective view of the heat sink fan shown in FIG. 7, with the heat sink and the housing being disassembled.

DETAILED DESCRIPTION OF THE PREFERRED EMBODIMENTS

Figure 1:
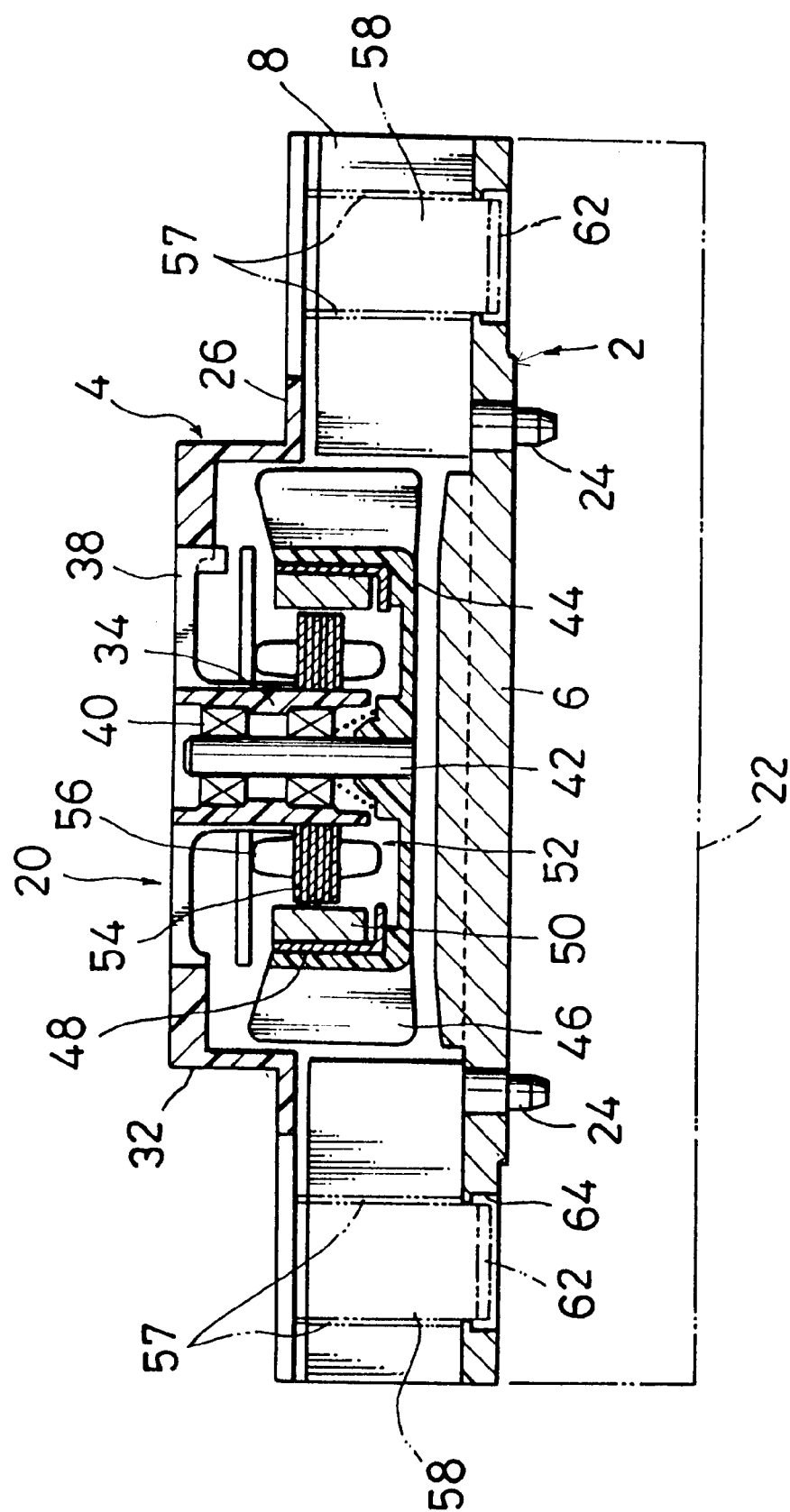
FIG. 1 is a cross-sectional view of a first embodiment of the heat sink fan of the present invention.

With reference to FIGS. 1 and 2, the heat sink fan comprises a heat sink 2 and a housing 4 which is detachably coupled with the heat sink 2. The heat sink 2 has a rectangular bottom portion 6, on which a plurality of plate-like cooling fins 8 are integrally formed in rows and laterally spaced apart from each other. The cooling fins 8 extend straight in the longitudinal direction of the heat sink 2. In the first embodiment of the present invention, the outermost cooling fins of the cooling fins 8 are formed with rectangular cut-outs 10 and 12 near their both ends. The bottom of the cut-outs 10 and 12 respectively have a protruding portion somewhat projecting from the upper surface of the bottom portion 6, and a receiving portion 14 formed with a through-hole 16 vertically passing therethrough. Furthermore, in the central portion of the heat sink 2 is formed a circular recess 18 where cooling fins 8 are cut-off. A fan 20 mounted on the housing 4 is accommodated within this circular recess 18.

The heat sink 2 can be formed, for example, from an aluminum die-casting. As shown in FIG. 1, the heat sink 2 is, for example, mounted directly on a semiconductor device 22, such as a microprocessor, as a heat generating device such that the heat generated by the semiconductor device 22 is transferred to the heat sink 2 and dispersed thereby. In this embodiment, fixing pins 24 are fixed on the heat sink 2 near the corners of the lower side of the bottom portion 6 of the heat sink 2. The external shape of a semiconductor device 22 is substantially the same as that of the heat sink 2 for cooling said semiconductor device 22. The heat sink 2 is mounted on the semiconductor device 22 such that the substantially entire surface of the semiconductor device 22 is covered by the bottom 6 of the heat sink 2. Near the four corners of this semiconductor device 22, depressions corresponding to said fixing pins 24 are provided so that said fixing pins 24 of the heat sink 2 are received in the corresponding depressions of the semiconductor device 22 to thereby ensure the predetermined relative portion of the heat sink 2 and the semiconductor device 22.

The housing 4 has a rectangular top wall 26 and a pair of side walls 28 and 30 which extend vertically downwardly from both sides of the top wall 26. The fan 20 is mounted on the central portion of the top wall 26. The fan 20 has a hollow cylindrical fan housing 32 made of a synthetic resin material and integrally formed with the housing 4. A cylindrical wall 34 for supporting the fan 20 is provided in the inner side of the fan housing 32. The fan housing 32 and the cylindrical wall 34 are connected by a plurality of webs 36 which are circumferentially disposed and spaced apart from one another. An air passage 38 through which cooling air is sucked is formed between the adjacent webs 36. In the cylindrical wall 34, the shaft 42 is rotatably supported by a pair of bearings 40. A cup-shaped rotor 44 is fixed on one end portion of the shaft 42. On the outer peripheral surface of the rotor 44, a plurality of blades 46 are integrally provided and circumferentially spaced apart from one another. On the other hand, a rotor magnet 50 is secured to the inner peripheral surface of the rotor 44 and the annular yoke 48 is interposed therebetween. A stator 52 which includes a stator core 54 fixed on the cylindrical wall 34 and a coil 56 wound around the stator core 54 is disposed so as to oppose the rotor magnet 50.

In the first embodiment of the present invention, the side walls 28 and 30 of the housing 4 includes a pair of engaging elements 58 and 60. Near both lower ends of one of the side wall 28, a pair of slits 57 extending upward to the top wall 26 are formed, and the engaging element 58 is integrally formed on the side wall 28 by a pair of slits 57. Near both lower ends of the other side wall 30, a pair of slits 59 extending upward to the top wall 26 are also formed, and the engaging element 60 is integrally formed on the side wall 30 by a pair of slits 59. The width of each of the engaging elements 58 and 60 is set to be nearly the same as that of the corresponding cut-outs 10 and 12 of the heat sink 2. Configured in a manner as mentioned above, the engaging elements 58 and 60 are received in the corresponding cut-outs 10 and 12 by being slightly flexed inwardly due to the elastic deformation at their corner portions (the connecting portion with the top wall portion 26).

On the tip of the engaging elements 58 and 60, hooks 62 projecting outward are integrally formed. As shown in FIG. 1, the tip of each of the engaging elements 58 and 60 is inserted into and passes through the through-hole 16 of the corresponding receiving portion 14. The hook 62 at its tip portion, after passing through the through-hole 16, disengagebly engages the lower end of the wall of the opening. As shown in FIG. 1, in order to prevent the hooks 62 of the engaging elements 58 and 60 from protruding downwardly from the lower surface of the bottom portion 6 of the heat sink 2, depressions 64 are formed on the lower surface of said bottom portion 6 to accommodate the hooks 62 of the corresponding engaging elements 58, 60.

On both ends of the top wall 26 of the housing 4, rectangular cut-outs 66 extending inwardly toward the fan housing 32 are formed. Those cut-outs 66 expose both ends of a plurality of cooling fins 8 to the ambient atmosphere, thus enhancing the cooling effect of the cooling fins 8.

In the following, explanation will be made about how to assemble the heat sink fan having above mentioned configuration. In order to attach the heat sink fan to the semiconductor device 22, first, the heat sink 2 is attached to the top surface of the semiconductor device 22. This procedure can be attained by inserting each fixing pin 24 of the heat sink 2 into the corresponding depression of the semiconductor device 22. In order to further ensure the mounting of the heat sink 2 to the semiconductor device 22, an adhesive or an adhesive tape can may be employed.

Then, the housing 4 is coupled to the heat sink 2. For the coupling of the housing 4, a pair of side walls 28 and 30 are positioned just outside of the outermost cooling fins 8 of the heat sink 2. Then the engaging elements 58 and 60 of the side walls 28 and 30 are pushed slightly inward to be put in the cut-outs 10 and 12 of the heat sink 2, and in this condition, the housing 4 is moved downward relative to the heat sink 2. The method for coupling the housing 4 to the heat sink 2 as mentioned above permits the tip of the engaging elements 58 and 60 to pass through the through-hole 16 of the receiving portion 14, and their hooks 62 comes into engagement with the lower end wall of the openings of the through-holes 16 by the force of elastic restitution of the engaging elements 58 and 60, thus the housing 4 is detachably coupled to the heat sink 2 as shown in FIG. 1.

In this coupled condition, the side walls 28 and 30 of the housing 4 are positioned outside of the outermost cooling fins 8 at both sides of the heat sink 2. The engaging elements 58 and 60 of the side walls 28 and 30 are positioned inside of the corresponding cut-outs 10 and 12 of the heat sink 2. The hooks 62 of the engaging elements 58 and 60 are received by the openings of the through-holes 16 of the receiving portion 14. Thus, the housing 4 is securely and detachably coupled to the heat sink 2. The rotor 44 and the blades 46 of the fan 20 mounted on the housing 4 are accommodated in the recess 18 of the heat sink 2.

When the rotor 44 rotates in the predetermined direction in this coupled condition, air is sucked through the air passages 38 of the housing 4 by the effect of turning blades 46, thereby creating air flow over the cooling fins 8. The heat generated by the semiconductor device 22 is conducted to a plurality of cooling fins 8 through the bottom 6 of the heat sink 2, and the semiconductor device 22 is cooled as desired by forcibly cooling the cooling fins 8 when air sucked in by the blades 46 flows along these cooling fins 8. Furthermore, to detach the housing 4 from the heat sink 2, press the engaging elements 58 and 60 slightly inward to flex them so that the hook 62 is disengaged from the opening of the through-hole 16 of the receiving portion 14. Then, the housing 4 is moved upwardly from the heat sink 2.

Figure 3:
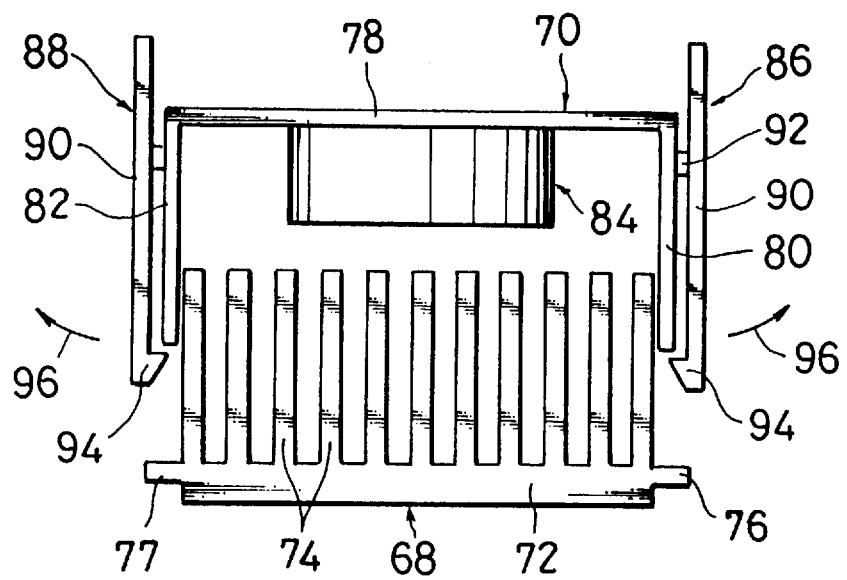
FIG. 3 is a front view of a second embodiment of heat sink fan according to the present invention, in which the housing is detached from the heat sink.

FIG. 3 shows a second embodiment of the heat sink fan according to the present invention. The heat sink fan of this second embodiment comprises a heat sink 68 and a housing 70 which is detachably coupled with the heat sink 68. The heat sink 68 has a rectangular bottom portion 72, on which top surface a plurality of cooling fins 74 are integrally formed and laterally spaced apart from each other. The cooling fins 74 extend straight in the longitudinal direction of the heat sink 68. In the embodiment shown in FIG. 3, engaging flanges 76 and 77 are formed at the base of the outermost cooling fins 74 of the heat sink 68 at the central portion thereof with regard to the longitudinal direction. The flanges 76 and 77 extend outward.

The housing 70 shown in FIG. 3 has a rectangular top wall 78, and a pair of side walls 80 and 82 which extend vartically downwardly from both sides of the top wall portion 78. A fan 84 is mounted on the central portion of the top wall 78. The configuration of the fan 84 itself is substantially the same as that of the first embodiment as described above.

In the second embodiment, the side walls 80 and 82 of the housing 70 are respectively formed with the engaging elements 86 or 88. Because the engaging elements 86 and 88 have substantially the same configuration with each other, only one of the two will be described below. The engaging element 86 has a body portion 90 extending vertically, and the intermediate portion of the body portion 90 is connected to the side wall 80 through a connector piece 92. On the inner surface of the lower tip of the body portion 90, a hook 94 is formed to slightly protrude inward. Furthermore, the upper tip of the body portion 90 extends upward beyond the top wall 78 of the housing 70. Such an engaging element 86 can be made of a synthetic resin material and its connector piece 92 is fixed to the side wall 80. The width of each of engaging elements 86 and 88 is nearly equal to that of the engaging elements 58 and 60 of the heat sink fan of the first embodiment. Still furthermore, other configurations of the heat sink fan of the second embodiment are substantially the same as those of the first embodiment as mentioned above.

The housing 70 is coupled to the heat sink 68 as follows. As shown in FIG. 3, positioning a pair of side walls 80 and 82 of the housing 70 is positioned outside of the outermost cooling fins 74 of the heat sink 68, and in this condition, the housing 70 is moved downward to the heat sink 68. Movement of the housing 70 in that way subjects the connecting portion 92 to slight elastic deformation so that the hooks 94 of the engaging elements 8G and 88 ride over the engaging flanges 76 and 77 of the heat sink 68, and the engaging elements 86 and 88 elastically deform in the direction indicated by the arrow 96 (in the direction in which the hook 94 moves outward). When the hooks 94 ride over the engaging flanges 76 and 77, the connecting portion 92 will return to the original state to thereby engage the hooks 94 of the engaging elements 86 and 88 with the engaging flanges 76 and 77 of the heat sink 68 in a disengageable fashion, and the housing 70 is thereby detachably coupled with the heat sink 68.

In this coupled condition, the side walls 80 and 82 of the housing 70 are positioned outside of the outermost cooling fins 74 on both sides of the heat sink 68, and the engaging elements 86 and 88 on the side walls 80 and 82 are in engagement with the corresponding engaging flanges 76 and 77 of the heat sink 68. Thus, the housing 70 is securely coupled to the heat sink 68 in a detachable fashion. Furthermore, to detach the housing 104 from the heat sink 102, the top ends of a pair of engaging elements 86 and 88 are pushed in detaching direction, namely, inward so as to cause elastic deformation in the direction indicated by the arrow 96 and to thereby disengage the hooks 94 from the engaging flanges 76 and 77 of the heat sink 68. In this condition, the housing 70 is moved upward and detached from the heat sink 68.

Figure 4:
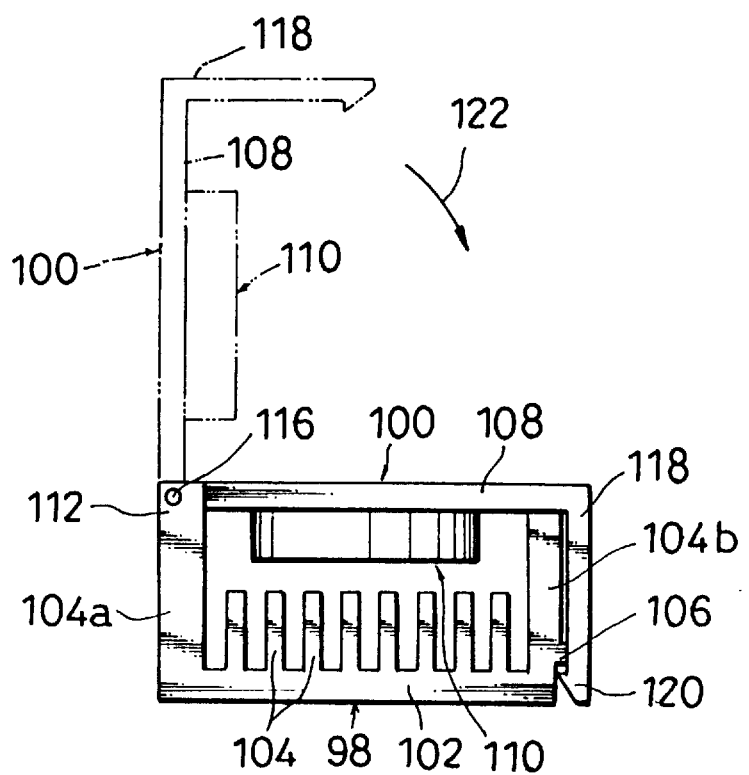
FIG. 4 is a front view of a third embodiment of heat sink fan of the present invention.
Figure 5:
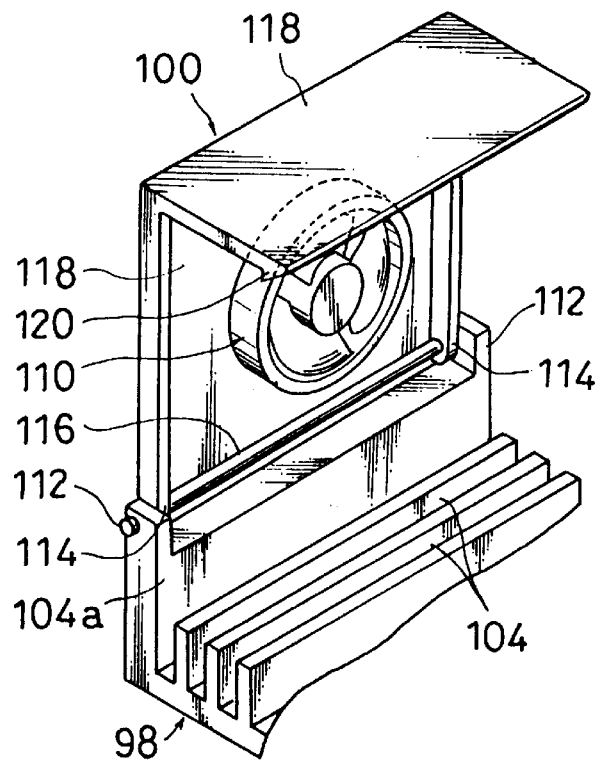
FIG. 5 is a partial perspective view of the heat sink fan shown in FIG. 4, with the housing held in an open position.

FIG. 4 is a front view showing a third embodiment of the heat sink fan according to the present invention, and FIG. 5 is a partial perspective view of the essential part of the heat sink fan as shown in FIG. 4. In FIGS. 4 and 5, the heat sink fan of the third embodiment comprise a heat sink 98, and a housing 100 which is detachably coupled to this heat sink 98. The heat sink 98 has a rectangular bottom portion 102, on which upper surface a plurality of plate-like cooling fins 104 are integrally formed and laterally spaced apart from each other, with the cooling fins 104 extending straight in the longitudinal direction of the heat sink 98. In the third embodiment, the outermost cooling fins 104*a* and 104*b* extend upward beyond other the cooling fins 104 located therebetween. On the outer surface of the cooling fin 104*b* is formed an engaging flange 106 extending in the longitudinal direction thereof.

The housing 100 shown in FIGS. 4 and 5 has a rectangular top wall 108, And a fan 110 is mounted on the top wall 108 at its central portion to forcibly cool a plurality of cooling fins 104 (including 104*a* and 104*b*). The configuration of this fan 110 itself is substantially the same as that of in the first embodiment described above. In this embodiment, one side of the top wall 108 is hinged to one of the outer cooling fin 104*a* of the heat sink 98. On both ends of the outer cooling fin 104*a* is formed a pair of supporting projections 112 extending upward with a rectangular space or cut-out is formed between those supporting projections 112. In addition, a supporting portion 114 are formed at both ends of one side of the top wall 108. That side of the top wall 108 is positioned between a pair of supporting projections 112, and the housing 100 is hinged to the heat sink 98 by a pin or rod member 116 extending through the supporting projections 112 and the supporting portion 114 such that the housing 100 can freely seings between the OPEN position as shown by the two-dot chain or phantom line in FIG. 4 and also shown in FIG. 5, and the CLOSE position as shown by the solid line in FIG. 4.

A side wall 118 is integrally formed on the other side of the top wall 108 of the housing 100 to extend vartically downwardly therefrom. On the inner surface of the tip portion of the side wall portion 118 is formed a pawl 120 slightly projecting inward. The pawl 120 extends in the longitudinal direction of the side wall portion 118. The other configurations of the heat sink fan of this third embodiment are substantially the same as that of the first embodiment described above.

The housing 100 is coupled to the heat sink 98 in the following manner. As shown in FIGS. 4 and 5, one side of the top wall 108 of the housing 100 is positioned between a pair of supporting projections 112 of the outer cooling fin 104a of the heat sink 98, and both ends of the pin or rod member 116 is passed through the supporting projections 112 and the supporting portion 104 of the top wall portion 108. Then, the housing 100 is swung for the CLOSE position as indicated by the arrow 122. Movement of the housing 100 in that manner permits the pawl 120 of the side wall portion 118 to ride over the engaging flange 106 of the outer cooling fin 104b of the heat sink 98 to thereby engage the flange 106 in a disengageable fashion so that the housing 100 is detachably coupled to the heat sink 98.

In this coupled condition, one side of the top wall 108 of the housing 100 is connected to the outer cooling fin 104a by the pin member 116, and the pawl 120 of the side wall 118 engages the engaging flange 106 of the other outer cooling fin 104b, thereby ensuring the coupling of the housing 100 with the heat sink 98. To detach the housing 100 from the heat sink 98, the side wall 118 is slightly deformed elastically to thereby disengage the pawl 120 from the engaging flange 106. In this condition, the housing 100 is turned about the pin member 116 in the opening direction (in the direction opposite to the arrow 122) until it is stopped. Then, the pin member 116 is removed from the supporting projections 112 of the cooling fin 104a and from the supporting portion 114 of the top wall portion 108.

Figure 6:
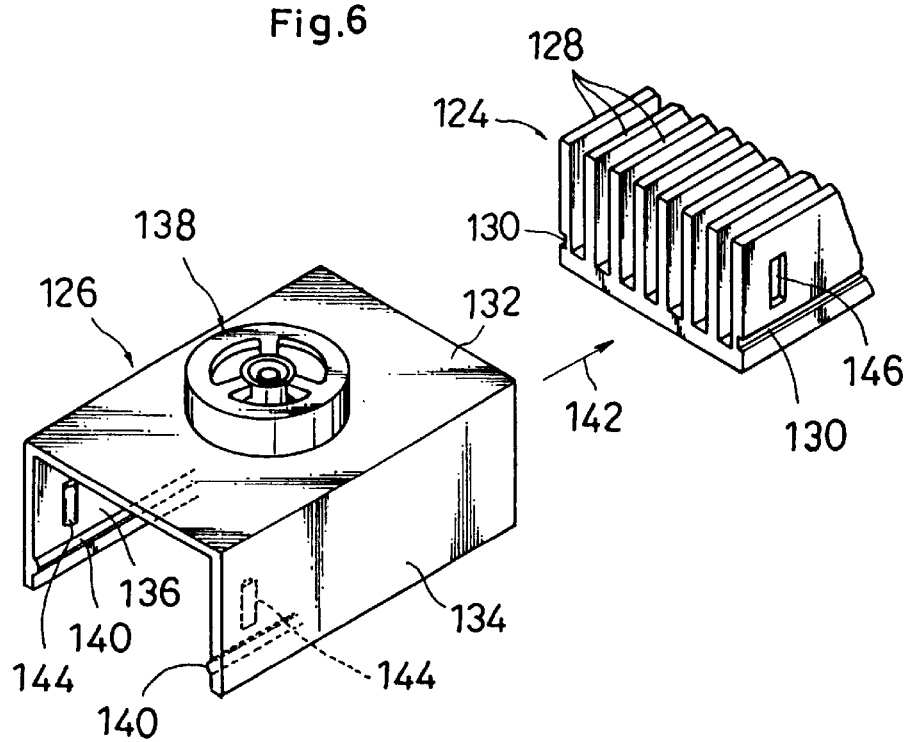
FIG. 6 is a partially sectional view of a forth embodiment of the heat sink fan according to the present invention with the housing detached from the heat sink.

FIG. 6 illustrates a forth embodiment of the heat sink fan according to the present invention, in the condition with the housing being detached from the heat sink. With reference to FIG. 6, the heat sink fan of the forth embodiment comprises a heat sink 124, and a housing 126 which is detachably coupled with the heat sink 124. The heat sink 124 has a rectangular bottom portion (not shown) as in the first embodiment, and a plurality of cooling fins 128 are integrally formed on the upper surface of the bottom portion and laterally spaced apart from each other. The cooling fins 128 extend straight in the longitudinal direction of the heat sink 124. In the forth embodiment, guide grooves 130 are formed on the outer surfaces of the outermost cooling fins 128 to extend straight in the longitudinal direction thereof The housing 126 shown in FIG. 6 has a rectangular top wall 132 and a pair of side walls 134 and 136 which extend vertically downwardly from both sides of the top wall 132. A fan 138 is mounted on the central portion of the top wall portion 132. The configuration of the fan 138 itself is substantially the same as that of the above mentioned first embodiment.

In the forth embodiment, guide projections 140 corresponding to the guide grooves 130 of the heat sink 124 are formed on the inner surfaces of the side walls 134 and 136 of the housing 126 and they extend straight in the longitudinal direction. The guide grooves 130 and the guide projections 140 constitute a means for guiding the housing 126 to the heat sink 124 in the direction indicated by the arrow 142, and the housing 126 is slid in the direction indicated by the arrow 142 and guided to the heat sink 124 by the guiding means. Furthermore, the guiding means may be constituted of guide projections formed on the outermost cooling fins 128, and guide grooves formed on the side walls 134 and 136 of the housing 126.

In this embodiment, the heat sink 124 is further formed with a means for locking the housing 126 in a longitudinal predetermined position. This locking means comprises a combination of locking projections 144 formed on the inner surfaces of the side walls 134 and 136, and locking holes 146 formed on the outer cooling fins 128 on both sides. The housing 126 is slid to the predetermined position where the projections 144 are placed in the corresponding locking holes 146, thereby retaining the housing 126 in position in an unlockable fashion. As a modification, the projections 144 may be located on the outer surfaces of the outer cooling fins 128, and the locking holes 146 on the side walls 134 and 136. The other configurations of the heat sink fan of this forth embodiment are substantially the same as that of the first embodiment described above.

The housing 126 is coupled to the heat sink 124 in the following manner. A pair of side walls 134 and 136 of the housing 126 are positioned outside of both outer cooling fins 128 of the heat sink 124, with the guide projections 140 of the side walls 134 and 136 being fitted in the guide grooves 130 of the cooling fins 128. In this condition, the housing 126 is moved to the predetermined position in the direction indicated by the arrow 142 until the projections 144 of the side walls 134 and 136 are received by the locking holes 146 of the outer cooling fins 128 of the heat sink 124 in a disengageable fashion, thereby detachably coupling the housing 126 to the heat sink 124.

In this coupled condition, the side walls 134 and 136 of the housing 126 are positioned outside of the cooling fins 128 on both sides of the heat sink 124. The projections 144 of the side walls 134 and 136 are received by the corresponding locking holes 146 of the heat sink 124. Thus, the housing 126 is firmly coupled to the heat sink 124 in a detachable fashion. Furthermore, to detach the housing 126 from the heat sink 124, the housing 126 may be simply moved away from the heat sink 124 in the detaching direction. Movement of the housing 126 in that way disengages the projections 144 from the locking holes 146, thereby the housing 126 from the heat sink 124.

Figure 7:
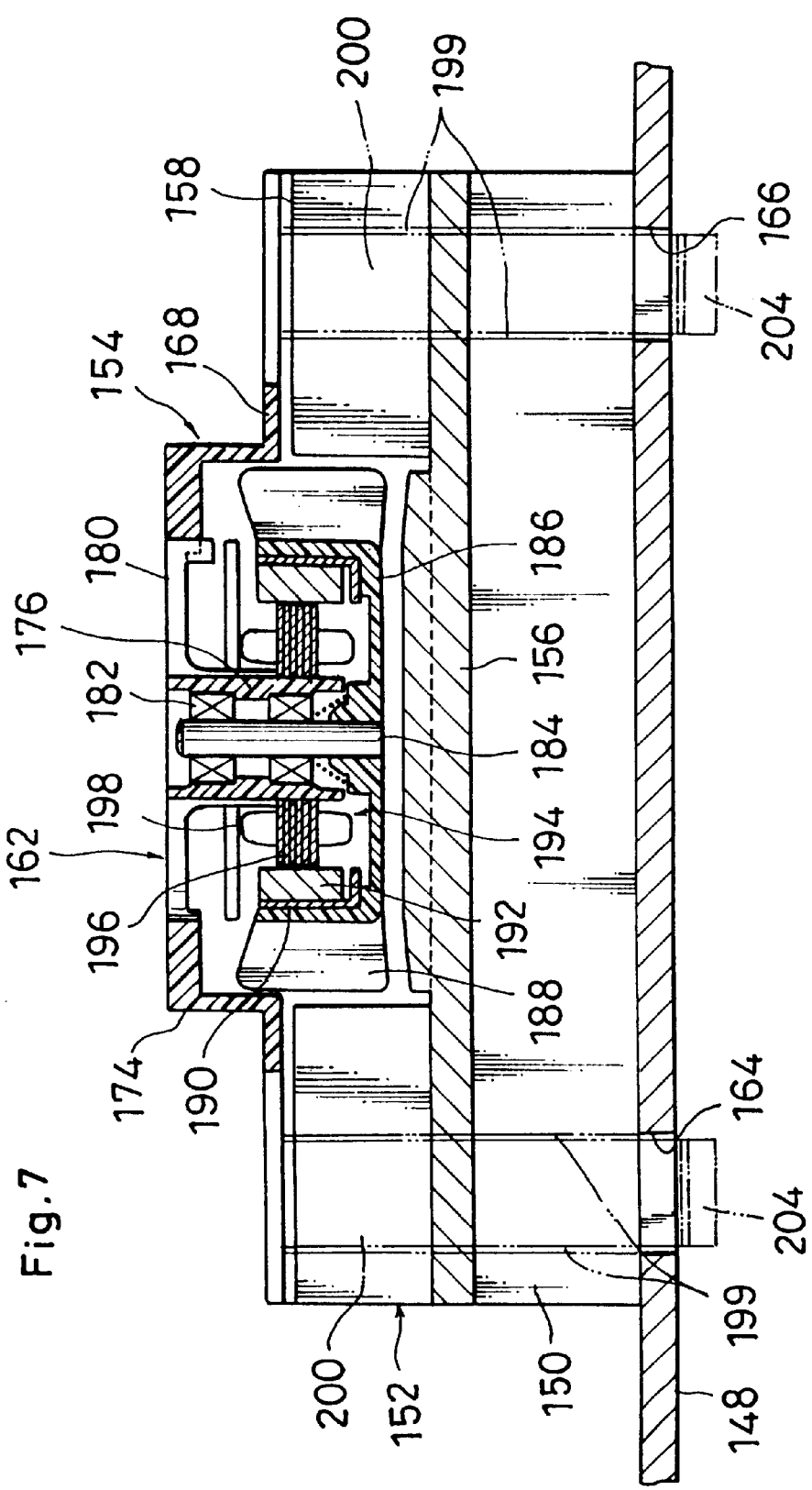
FIG. 7 is a sectional view of a fifth embodiment of the heat sink fan according to the present invention.
Figure 9:
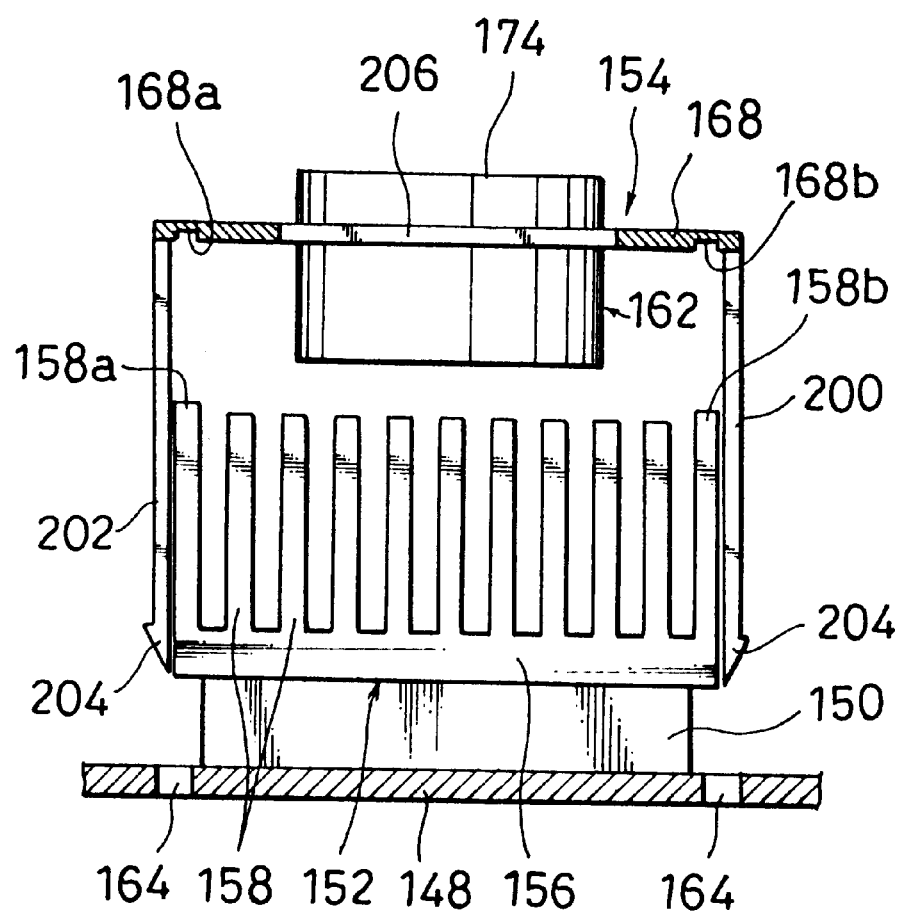
FIG. 9 is a cross-sectional view of the heat sink fan shown in FIG. 7, with the heat sink and the housing being disassembled.
Figure 10:
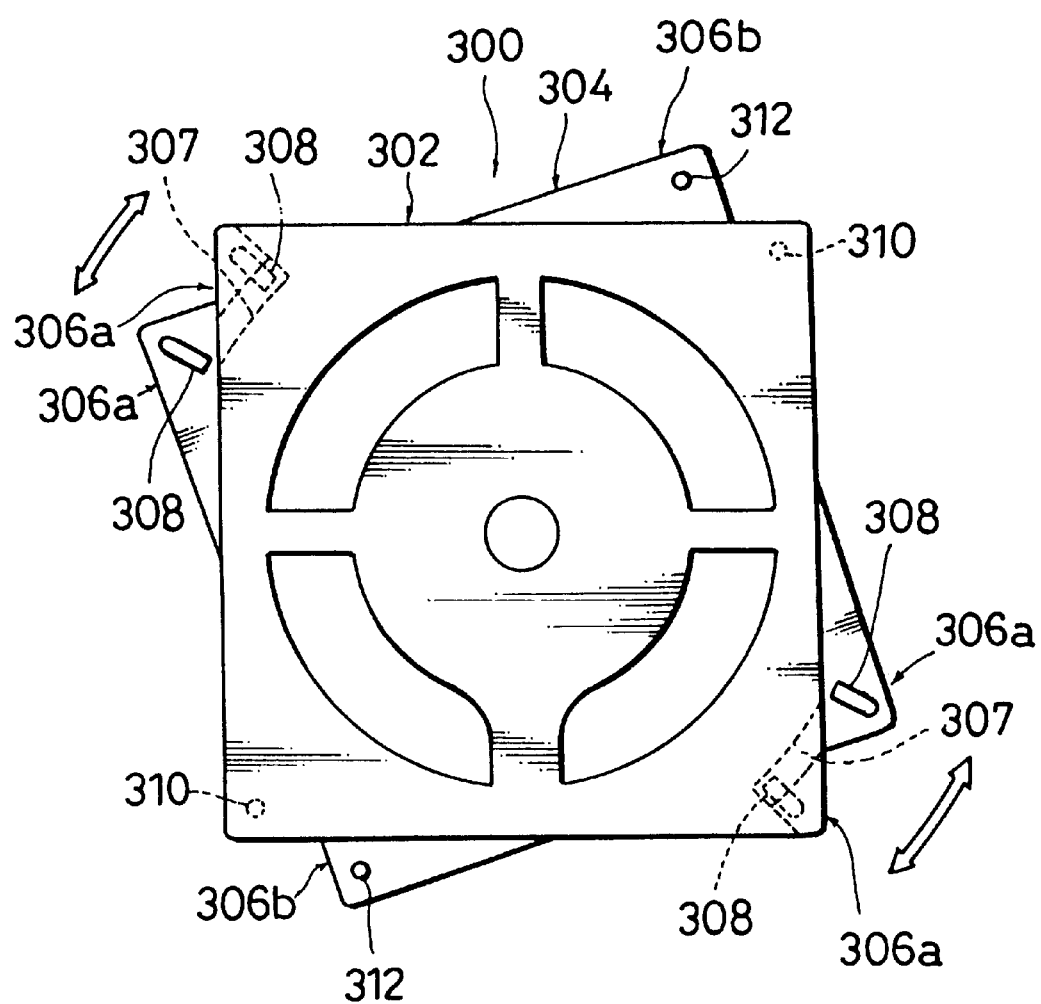
FIG. 10 is a plan view of a conventional heat sink fan illustrating the manner of coupling a heat sink with a housing.

FIGS. 7 through 9 illustrate a fifth embodiment of the heat sink fan according to the present invention. In this embodiment, the heat sink fan is directly coupled to a semiconductor device 150 which in turn is mounted on the circuit board 148, and comprises a heat sink 152 designed to disperce the heat generated by the semiconductor device 150, and a housing 154 formed to enclose this heat sink 152 and detachably coupled to the circuit board 148. The heat sink 152 comprises a plurality of plate-like cooling fins 158 that are integrally formed on the upper surface of the rectangular bottom 156 and laterally spaced apart from each other. The cooling fins 158 extend straight in the longitudinal direction of the heat sink 152 is parallel with each other, a circular recess 160 is formed in the central portion of the heat sink 152 with some of a plurality of cooling fins 158 being cut out. In this circular recess 160, a fan 162 mounted on the housing 154 is accommodated.

The heat sink 152 may be made by, for example, an aluminum die-casting. As shown in FIGS. 7 through 9, the heat sink 152 is directly mounted on a semiconductor device 150 as a heat generating device, for example, in such a manner that the heat generated by the semiconductor device 150 can be radiated or dispersed. The external shape of the semiconductor device 150 is nearly the same as that of the heat sink 152, which is attached to the semiconductor device such that the substantially entire area of the semiconductor device 150 is covered by the bottom portion 156 of the heat sink 152. Further, the circuit board 148 to which the semiconductor device 150 is mounted, is formed vertical through-holes 164 and 166 on both sides of the semiconductor device 150.

The housing 154 has a rectangular top wall 168, and a pair of side walls 170 and 172 extending vartically downwardly from both sides of the top wall 168. A fan 162 is mounted at the central portion of the top wall 168. The fan 162 has a hollow cylindrical fan housing 174 which is made of a synthetic resin material integrally with the housing 154. Inside of the fan housing 174 is formed a cylindrical wall 176 for supporting the shaft 184 of the fan 162. The fan housing 174 and the cylindrical wall 176 are connected with each other by the webs 178 which in turn are circumferentially disposed and spaced apart from each other. Air passages 180 for the intake of cooling air are formed between the adjacent webs 178. In the cylindrical wall 176, the shaft 184 is rotatably supported by a pair of bearings 182. A cup-shaped rotor 186 is fixed on one end of the shaft 184. A plurality of blades 188 are integrally formed on the outer peripheral surface of the rotor 186 and spaced from one another along the circumference of the rotor 186. A rotor magnet 192 is secured on the inner peripheral surface of the rotor 186 and an annular yoke 190 is interposed therebetween. A stator 194 is disposed to oppose the rotor magnet 192, and has a stator core 196 fixed on the outer peripheral surface of the cylindrical wall 176, and a coil 198 wound around the stator core 196.

Two pairs of engaging elements 200 and 202 are formed on the side walls 172 and 174 of the housing 154. A pair of slits 199 are formed on both sides of each engaging element 200 extending upward from the lower edge to the top of the wall 168 such that they can elastically deform independently of the side wall 172. Furthermore, on the other of side wall 174 is formed a pair of slits 201. A pair of slits 201 are also formed on both sides of the each engaging elements 202 to ensure elasticity of the elements 202. The engaging elements 200 and 202 extend beyond respective lower edges of the side walls 172 and 174. The width each of the engaging elements 200 and 202 is nearly equal to that of the corresponding through-holes 164 and 166 of the circuit board 148. Configured in this way, the engaging elements 200 and 202 are flexed slightly inward by the elastic deformation at their corner portions (the portions connected to the top wall 168), such that the engaging elements 200 and 202 are received in the corresponding through-holes 164 and 166.

A hook 204 projecting outward is integrally formed on each tip of the engaging elements 200 and 202. As shown in FIG. 7, the tip portions of the engaging elements 200 and 202 are inserted into the corresponding through-holes 164 and 166, and the hooks 204 of the tip portions pass through the through-holes 164 and 166 and disengageably engage bottom surface of the circuit board 146 around the openings.

At both ends of the top wall 168 of the housing 154 are formed rectangular cut-outs 206 extending inward to the fan housing 174 from both ends. The cut-outs 206 formed in this manner exposes both ends of a plurality of cooling fins 158 to the ambient atmosphere, thereby increasing the cooling effect of the cooling fins 158.

In the following, explanation will be made about the procedure to couple the heat sink fan of above mentioned configuration to the circuit board 148. To couple the heat sink fan to the circuit board 148, the heat sink 152 is first attached to the top surface of the semiconductor device 150 which is mounted on the circuit board 148 by means of soldering or the like.

Then, the housing 154 is secured to the heat sink 152. For mounting of the housing 154, a pair of side walls 172 and 174 are positioned outside of both outermost cooling fins 158 of the heat sink 152, and the engaging elements 200 and 202 of the side walls 172 and 174 are pushed slightly inward to be positioned in the through-holes 164 and 166 of the circuit board 148. From this condition, the housing 154 is moved downward to the heat sink 152 until they are firmly engaged. Engagement in this way permits the tip portions of the engaging elements 200 and 202 to project through the through-holes 164 and 166. By the force of elastic restitution of the engaging elements 200 and 202, the hooks 204 will be brought into engagement with the bottom surface of the circuit board 148 around the openings of the through-holes 164 and 166, whereby the housing 154 is detachably coupled to the heat sink 152 as shown in FIG. 7.

In this coupled condition, the side walls 172 and 174 of the housing 154 are positioned outside of the cooling fins 158 at both sides of the heat sink 152, and the hooks 204 of the engaging elements 200 and 202 of the side walls 172 and 174 are received by the openings of the corresponding through-holes 164 and 166 of the circuit board 148, whereby the housing 154 is firmly coupled to the heat sink 152 in a detachable fashion, and the rotor 186 and the blades 188 of the cooling fan 162 mounted on the housing 154 are accommodated in the recess 160 of the heat sink 152.

When the rotor 186 is rotated in the predetermined direction in this coupled condition, air is taken in through the air passages 180 of the housing 154 by the blades 188 and air flow is caused thereby in the longitudinal direction along the cooling fins 158.

The heat generated by the semiconductor device 150 is conducted to a plurality of cooling fins 158 through the bottom 156 of the heat sink 152 which is directly secured on the semiconductor device 150. When the air sucked in by the turning blades 188 flows along the cooling fins 158, these cooling fins 158 are forcibly cooled, thereby cooling the semiconductor device 150 as desired. Additionally, to detach the housing 154 from the heat sink 152, the hooks 204 are disengaged from the openings of the through-holes 164 and 166 by pressing and flexing the engaging elements 200 and 202 slightly inward. Then, the housing 154 is mounted upward from the circuit board 148.

Furthermore, to attach the heat sink 152 to the semiconductor device 150 enabling heat conduction, the outermost cooling fins 158a and 158b of a plurality of cooling fins 158 are relatively larger in the vertical direction than the other cooling fins 158 as shown in FIG. 9, such that the top ends of the outer cooling fins 158a and 158b are received in the (concave) grooves 168a and 168b which in turn are formed on the lower side of the top wall 168 of the housing 154 at the portion corresponding to the end of the outer cooling fins 158a and 158b. Then, the bottom 156 of the heat sink 152 is pressed against the top surface of the semiconductor device 150 by the housing 154, to thereby being the housing 154 into firm engagement with the circuit board 148. Otherwise, the heat sink 152 may be mounted on the semiconductor device 150 with the heat sink 152 being fixed to the housing 154 by means of screw or other fixing means, and then the housing 154 is coupled to the circuit board 148. Furthermore, in the case when the heat sink 152 is previously mounted on the semiconductor device 150, the heat sink 152 may be fixed to the semiconductor device 150 with pins or other projections on the lower side of the bottom portion 156 of the heat sink 152 being receiving by depressions or the like formed on the corresponding positions of the semiconductor device 150. Still further, the semiconductor device 150 may be affixed to the heat sink 152 by adhesive or the like.

Furthermore, in the fifth embodiment of the present invention as described above, two engaging elements 200 and 202 are provided each on the side walls 172 and 174. When the housing 154 can be securely engaged, engaging elements 200 and 202 may be formed one each on the respective side walls 172 and 174.

Still furthermore, in order to avoid wrong engagement of the housing 154 to the heat sink 152 it is possible, for example, to make different from each other, as shown in FIG. 7, the sizes of the engaging elements 200 formed on the side wall 172, and those of their corresponding through-holes 164 and 166 respectively.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A heat sink fan for cooling an electric equipment mounted on a printed circuit board comprising:
   a fan motor having a plurality of blades;
   a heat sink having a base plate secured on the electric equipment and a plurality of radiating fins arranged on an upper surface of the base plate;
   a housing including a top wall supporting the fan motor and a pair of side panel vertically depended from the top wall so as to be located outward of both sides of the heat sink, and;
   at least one engagement segment made of elastic material and having a connecting means integrally formed on at least one of the side panel;
   wherein the printed circuit board has at least one through hole at the corresponding portion with the engagement segment, the connecting means detachably engages with the bottom surface of the printed circuit board around the through hole by elastic deformation.

2. A heat sink fan according to claim 1, wherein a pair of slits are formed on the side panel for defining the engagement segment.

3. A heat sink fan according to claim 1, wherein the connecting means includes a hook projecting laterally from the lower portion of the engagement segment so as to be coupled to the bottom surface of the printed circuit board around the through hole.

4. A heat sink fan according to claim 1, wherein the heat sink and the housing have a rectangular configuration and the side panels depend from the long sides of rectangle of the top wall.

5. A heat sink fan according to claim 4, wherein the detachably engaging means between the heat sink and the housing is at least one hook projects laterally from the side panel of the housing and at least one flange extending outwardly from at least one side of the heat sink.

6. A heat sink fan for cooling electric equipment mounted on a printed circuit board comprising:
   a fan motor having a plurality of blades;
   a heat sink having a base plate secured on the electric equipment and a plurality of radiating fins arranged on an upper surface of the base plate;
   a housing including a top wall supporting the fan motor and a pair of side panels vertically depending from the top wall so as to be located outwardly of both sides of the heat sink, the heat sink and the housing having a rectangular configuration, and the side panels depending from the long sides of the rectangle of the top wall and;
   at least one engagement segment made of elastic material and having a connecting means integrally formed on at least one of the side panels;
   wherein the printed circuit board has at least one through hole at the corresponding portion with the engagement segment, the connecting means detachably engages with the bottom surface of the printed circuit board around the through hole by elastic deformation, and the connecting means between the heat sink and the housing is at least one hook projecting laterally from the side panel of the housing and downwardly through at least one through hole formed in the printed circuit board.

7. A heat sink fan for cooling electric equipment mounted on a printed circuit board comprising:
   a fan motor having a plurality of blades;
   a heat sink having a base plate secured on the electric equipment and a plurality of radiating fins arranged on an upper surface of the base plate;
   a housing including a top wall supporting the fan motor and a pair of side panels vertically depending from the top wall so as to be located outwardly of both sides of the heat sink, the heat sink and the housing having a rectangular configuration, and the side panels depending from the long sides of the rectangle of the top wall and;
   at least one engagement segment made of elastic material and having a connecting means integrally formed on at least one of the side panels;
   wherein the printed circuit board has at least one through hole at the corresponding portion with the engagement segment, the connecting means detachably engages with the bottom surface of the printed circuit board around the through hole by elastic deformation, and the connecting means between the heat sink and the housing is a hinge means including a pin connected to the top wall of the housing and a pair of receiving means disposed on a top portion of one of the radiating fins and a hook projecting laterally from the side panel of the housing and a flange portion extending outwardly from one side of the heat sink.

8. A heat sink fan for cooling electric equipment mounted on a printed circuit board comprising:
   a fan motor having a plurality of blades;
   a heat sink having a base plate secured on the electric equipment and a plurality of radiating fins arranged on an upper surface of the base plate;
   a housing including a top wall supporting the fan motor and a pair of side panels vertically depending from the top wall so as to be located outwardly of both sides of the heat sink, the heat sink and the housing having a rectangular configuration, and the side panels depending from the long sides of the rectangle of the top wall and;

at least one engagement segment made of elastic material and having a connecting means integrally formed on at least one of the side panels;

wherein the printed circuit board has at least one through hole at the corresponding portion with the engagement segment, the connecting means detachably engages with the bottom surface of the printed circuit board around the through hole by elastic deformation, and the connecting means between the heat sink and the housing is a guide groove and a locking hole formed on the outer side of the heat sink and a guide rail and a locking projection formed on the inner side surface of the side panel of the housing.

* * * * *